United States Patent
Du et al.

(10) Patent No.: US 9,958,518 B2
(45) Date of Patent: May 1, 2018

(54) SHOULDER COIL AND TRANSMITTING COIL FOR MAGNETIC RESONANCE SYSTEM

(71) Applicants: Shu Du, Shenzhen (CN); Zeng He He, ShenZhen (CN); Wen Ming Li, Shenzhen (CN); Tong Tong, Shenzhen (CN); Jian Min Wang, Shenzhen (CN)

(72) Inventors: Shu Du, Shenzhen (CN); Zeng He He, ShenZhen (CN); Wen Ming Li, Shenzhen (CN); Tong Tong, Shenzhen (CN); Jian Min Wang, Shenzhen (CN)

(73) Assignee: Siemens Aktiengesellschaft, München (DE)

( * ) Notice: Subject to any disclaimer, the term of this patent is extended or adjusted under 35 U.S.C. 154(b) by 1114 days.

(21) Appl. No.: 13/974,534

(22) Filed: Aug. 23, 2013

(65) Prior Publication Data

US 2014/0058250 A1 Feb. 27, 2014

(30) Foreign Application Priority Data

Aug. 23, 2012 (CN) .......................... 2012 1 0302753

(51) Int. Cl.
G01R 33/34 (2006.01)
G01R 33/3415 (2006.01)
G01R 33/36 (2006.01)

(52) U.S. Cl.
CPC ........ G01R 33/34084 (2013.01); *G01R 33/34* (2013.01); *G01R 33/3415* (2013.01); *G01R 33/3642* (2013.01)

(58) Field of Classification Search
CPC .............. G01R 33/34084; G01R 33/34; G01R 33/341; G01R 33/32; G01R 33/3642; G01R 33/3415; A61B 5/055; A61B 5/4528

See application file for complete search history.

(56) References Cited

U.S. PATENT DOCUMENTS

| 5,143,068 A * | 9/1992 | Muennemann ........ A61B 5/055 324/318 |
| 5,343,862 A * | 9/1994 | Jones ............... G01R 33/34053 324/318 |
| 5,351,688 A | 10/1994 | Jones |
| 6,850,065 B1 | 2/2005 | Fujita et al. |
| 7,031,763 B1 * | 4/2006 | Zhang .................... A61B 5/055 324/318 |
| 7,466,130 B1 | 12/2008 | Votruba et al. |
| 7,663,367 B2 | 2/2010 | Wiggins |
| 2008/0284436 A1 * | 11/2008 | Weizenecker ..... G01R 33/3415 324/318 |
| 2009/0096456 A1 | 4/2009 | Biber et al. |
| 2009/0237081 A1 | 9/2009 | Biber et al. |

OTHER PUBLICATIONS

Korean Office Action for related Korean Application No. 10-2013-0099069, dated Jun. 23, 2015.
Japanese Office Action for related Japanese Application No. 2013-173108 dated Jul. 10, 2017, with English Translation.

* cited by examiner

*Primary Examiner* — Rishi Patel
(74) *Attorney, Agent, or Firm* — Lempia Summerfield Katz LLC

(57) ABSTRACT

A shoulder coil for a magnetic resonance system includes a receiving part. The shoulder coil also includes a transmitting part used for coupling a radio-frequency magnetic field of a body coil of the magnetic resonance system.

12 Claims, 3 Drawing Sheets

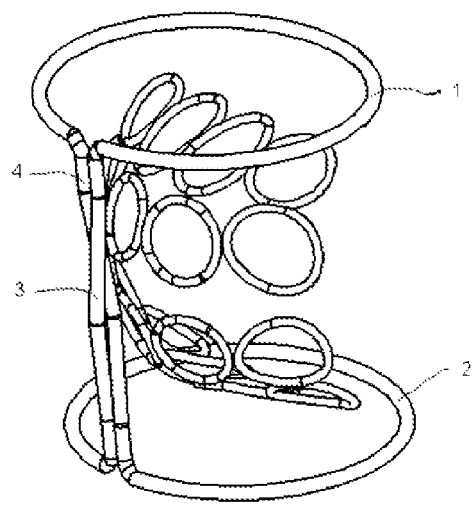
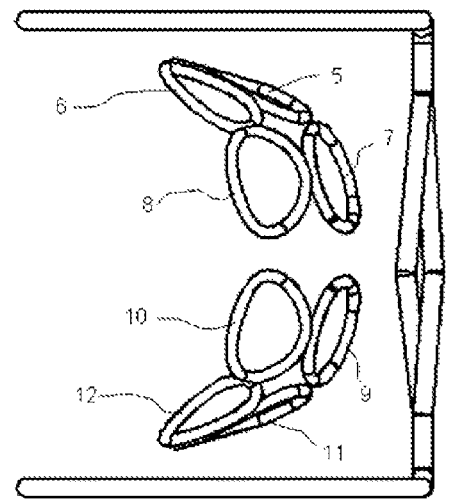
Fig. 1A
Fig. 1B

SHOULDER COIL AND TRANSMITTING COIL FOR MAGNETIC RESONANCE SYSTEM

This application claims the benefit of CN 201210302753.9, filed on Aug. 23, 2012, which is hereby incorporated by reference.

TECHNICAL FIELD

The present embodiments relate to the technical field of magnetic resonance imaging and, particularly, to a shoulder coil and a transmitting coil for a magnetic resonance system.

BACKGROUND

A magnetic resonance imaging (MRI) system includes various coils such as, for example, body coils covering the whole body, local coils covering only a certain part of the body, and so on. A body coil is a self-transmitting and self-receiving coil. Since the coverage of a body coil is relatively large, a higher transmit power is to be provided, and the signal to noise ratio of the resulting image is lower. The signal to noise ratio is not uniform throughout the image. Since the coverage of a local coil is relatively small (e.g., the knee covered by a knee coil, the head covered by a head coil, and the wrist covered by a wrist coil are all relatively small ranges), the local coil only receives radio frequency signals within a limited range of radio frequency excitation (e.g., in order to distinguish from radio frequency signals in the transmission stage, the radio frequency signals received by the coil are hereinafter referred to as magnetic resonance signals). Therefore, the signal to noise ratio of the resulting image is relatively high, and the signal to noise ratio is relatively uniform throughout the image.

Orthopedic imaging is an important direction of magnetic resonance application. In an orthopedic imaging clinical application of the magnetic resonance system, shoulder joint inspections use high quality images. Because of the complex structure of the shoulder joint, in order to obtain high quality shoulder joint images, specifically designed coils may be used. In order to make a patient feel comfortable and take the particularity of the position of the shoulder into consideration, the shoulder coil may be placed at the edge of a sickbed. The edge of the sickbed may be the edge that is close to a uniform magnetic field area, and the uniformity of the static magnetic field and the radio-frequency magnetic field of the edge area will be both reduced. This will cause image shape distortion or image quality degradation.

Coils currently used in magnetic resonance systems for accepting shoulder joint imaging may be phased array coils used as receiving coils. On the market, there are many special receiving phased array receiving coils for shoulder joint imaging. Receiving phased array coils are a collection of several closed receiving elements. Each coil unit receives signals via a low-noise preamplifier and an independent receiving channel and performs post-processing on the signals. In this way, images of a high signal to noise ratio, a small coil unit and a relatively large imaging area (FOV) may be obtained.

Transmitting/receiving coils combined by transmitting coils and receiving coils have been widely used in the magnetic resonance system. In the condition of using the same transmit power, compared with receiving phased array coils, transmitting/receiving coils may generate a radio-frequency magnetic field of a high intensity and high uniformity in the focusing area. This is because the transmitting/receiving coils have a special transmitting part that improves the transmission efficiency, which brings many beneficial effects to the application of the magnetic resonance system.

Transmitting/receiving coils that have a dedicated transmission cable for connecting to the magnetic resonance system use a high-power capacity switch circuit and a power distribution circuit. Although the design difficulty decreases, the costs of the coils and the system are greatly increased.

SUMMARY AND DESCRIPTION

Transmitting/receiving coils that have a dedicated transmission cable for connecting to the magnetic resonance system have the following disadvantages.

As described above, the transmitting/receiving coils have a dedicated transmission cable for connecting to the magnetic resonance system, and the magnetic resonance system also uses a corresponding dedicated transmission cable to connect to the transmitting/receiving coils. Also, the magnetic resonance system uses a dedicated transmitting/receiving switch circuit, power distribution circuit and connection circuit, thus causing the transmitting/receiving coils to be bulky and costly.

Transmitting/receiving coils that have a dedicated transmission cable for connecting to the magnetic resonance system may support high-power transmission using a thick cable, but the cable occupies a larger space, and the flexibility is not good, thereby bringing inconvenience to the practical clinical application.

The scope of the present invention is defined solely by the appended claims and is not affected to any degree by the statements within this summary.

The present embodiments may obviate one or more of the drawbacks or limitations in the related art. For example, the volume of the transmitting/receiving coils is reduced, the cost is lowered, and flexibility is improved. A shoulder coil for a magnetic resonance system includes a receiving part. The shoulder coil further includes a transmitting part for coupling a radio-frequency magnetic field of a body coil of the magnetic resonance system.

In one embodiment, the transmitting part includes a Helmholtz coil.

In another embodiment, the transmitting part includes two circular rings and two wires. The two circular rings are identical, parallel to each other and co-axial. The two circular rings respectively have an opening. Two ends of each opening are respectively connected to the two wires, and the two wires intersect an odd number of times.

In one embodiment, the transmitting part includes two circular rings and two wires. The two circular rings are identical and co-axial, and the two circular rings respectively have an opening. Two ends of each opening are respectively connected to the two wires. The two wires intersect for odd-numbered times, and the two circular rings bend toward each other at an end opposite to the respective opening.

In one embodiment, the circular ring includes one or more capacitors. The one or more capacitors are connected in series at equal intervals on the circular ring.

In another embodiment, a three-dimensional geometric center of the transmitting part coincides with a three-dimensional geometric center of the receiving part.

In one embodiment, the transmitting part is detachably connected to the receiving part.

A magnetic resonance system includes a shoulder coil, as described above.

A transmitting coil of a shoulder coil for a magnetic resonance system, for coupling a radio-frequency magnetic field of a body coil of the magnetic resonance system is provided. The transmitting coil includes two circular rings and two wires. The two circular rings are identical, parallel to each other and co-axial. The two circular rings respectively have an opening. Two ends of each opening are respectively connected to the two wires, and the two wires intersect for odd-numbered times.

Another embodiment of a transmitting coil of a shoulder coil for a magnetic resonance system, for coupling a radio-frequency magnetic field of a body coil of the magnetic resonance system is also provided. The transmitting coil includes two circular rings and two wires. The two circular rings are identical and co-axial. The two circular rings respectively have an opening. Two ends of each opening are respectively connected to the two wires. The two wires intersect for odd-numbered times, and the two circular rings bend toward each other at an end opposite to the respective opening.

Since the local coil for shoulder joint imaging in the magnetic resonance system includes a transmitting part and a receiving part, and the transmitting part couples a radio-frequency magnetic field from a body coil, the local coil does not need to be connected to the magnetic resonance system via a special transmission cable. The local coil thus has a delicate structure and requires a low cost. The receiving part also uses phased array coils and therefore may be optimized according to the structure of the shoulder joint. The shoulder coil may produce a uniform radio-frequency magnetic field area with a considerable intensity, thereby reducing the transmit power of the body coil and lowering the overall specific absorption ratio (SAR) of radio frequency. In the mechanical aspect, the transmitting part and the receiving part of this shoulder coil may be combined freely for use (e.g., the receiving part may be used alone, or the transmitting part and the receiving part are used together, so as to improve the flexibility of applications).

BRIEF DESCRIPTION OF THE DRAWINGS

FIG. 1A is a three-dimensional perspective view of one embodiment of a shoulder coil for a magnetic resonance system;

FIG. 1B is a perspective view of the left side of one embodiment of a shoulder coil for a magnetic resonance system;

DETAILED DESCRIPTION

Figure 2:
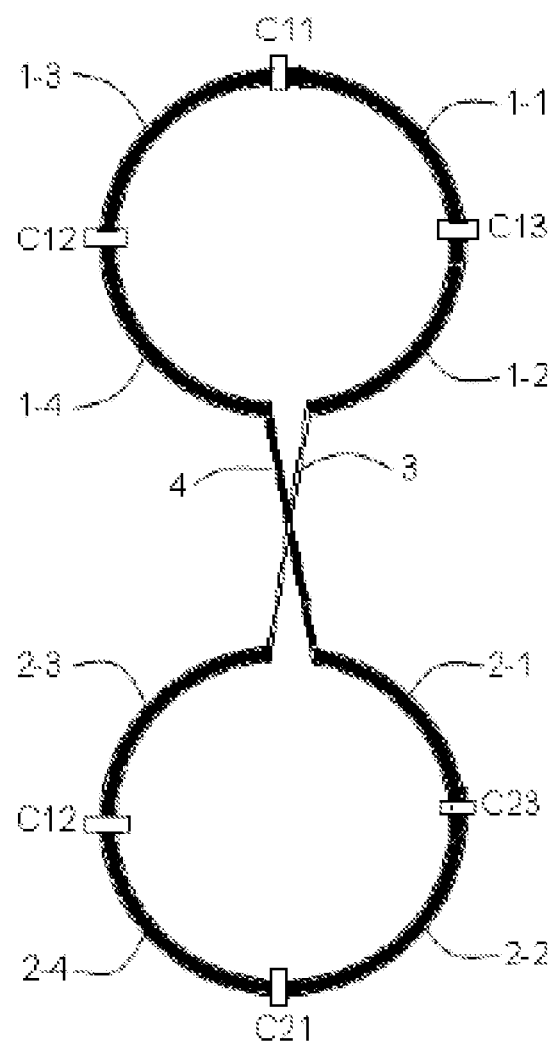
FIG. 2 is a schematic diagram of one embodiment of a quasi-Helmholtz coil of a shoulder coil for a magnetic resonance system.

It should be understood that the embodiments described herein are only used to illustrate the present invention but not to limit the present invention.

A shoulder coil for a magnetic resonance system includes a transmitting part and a receiving part that are mutually independent. The transmitting part couples a radio-frequency magnetic field transmitted by a body coil, so that no special transmission cable is needed, and the shoulder coil has a simple structure and requires a low cost. The receiving part uses phased array coils and may be optimized according to the structure of the shoulder joint.

In one embodiment, the shoulder coil for a magnetic resonance system includes a transmitting part and a receiving part. The transmitting part and the receiving part are mutually independent. The transmitting part strengthens the uniformity of a radio-frequency magnetic field via employing a conventional Helmholtz coil to couple the radio-frequency magnetic field of a body coil. At the same time, since the uniformity of the radio-frequency magnetic field is enhanced, the transmit power of the radio-frequency magnetic field may be reduced as appropriate. The receiving part is a phased array coil for receiving magnetic resonance signals fed back by a subject to be examined. A conventional Helmholtz coil is a pair of identical circular rings being parallel to each other and co-axial.

The Helmholtz coil may produce a considerably high, uniform radio-frequency magnetic field area, so the shoulder coil may reduce the transmit power of a body coil and lower the overall specific absorption ratio (SAR) of radio frequency. Additionally, in the mechanical aspect, the transmitting part and the receiving part of the shoulder coil are mutually independent, and therefore may be combined freely for use (e.g., the receiving part may be used alone, and the transmitting part and the receiving part may also be used together, so as to improve the flexibility of this shoulder coil).

Not only the Helmholtz coil may be used as a transmitting part, but also, other coils that may couple the radio-frequency magnetic field of the body coil may realize the same technical effects, such as birdcage coils.

FIG. 1A is a three-dimensional perspective view of one embodiment of a shoulder coil for a magnetic resonance system. FIG. 1B is a three-dimensional perspective view of one embodiment of a shoulder coil for a magnetic resonance system. FIGS. 1A and 1B only show the internal coils of the shoulder coil of the magnetic resonance system but do not show the external housing.

In the shoulder coil of the magnetic resonance system according to another embodiment, coupling also exists between two sub-coils of a conventional Helmholtz coil, which will affect the image quality of the magnetic resonance system.

As shown in FIGS. 1A and 1B, the shoulder coil of the magnetic resonance system includes a transmitting part TX and a receiving part RX. The transmitting part TX is a quasi-Helmholtz coil for coupling radio frequency signals of a body coil in the magnetic resonance system so as to strengthen the radio-frequency magnetic field, and the shape of the transmitting part TX may be adjusted according to the structure and size of the shoulder. The receiving part RX is a phased array coil for receiving magnetic resonance signals fed back by a subject to be examined.

As shown in FIG. 1A, the quasi-Helmholtz coil acting as the transmitting part TX includes two equal-sized, co-axial and parallel circular rings 1 and 2. The circular ring 1 and the circular ring 2 are disconnected at the same position in the radial direction and are connected together via an intersected wire 3 and wire 4 at the disconnecting point, thereby forming a quasi-Helmholtz coil. In other words, the circular ring 1 and the circular ring 2 respectively have an opening. Two ends of the opening are respectively connected to the wire 3 and the wire 4, and the wire 3 and the wire 4 intersect once. Alternatively, the wire 3 and the wire 4 intersect for odd-numbered times. In one embodiment, the distance between the circular ring 1 and the circular ring 2 equals to the radius of the circular ring 1 and the circular ring 2.

FIG. 2 is a schematic diagram of one embodiment of a quasi-Helmholtz coil of a shoulder coil for a magnetic resonance system. As shown in FIG. 2, the whole quasi-Helmholtz coil is expanded onto a plane in an "8" shape, and the quasi-Helmholtz coil includes a circular ring 1, a circular ring 2, a wire 3 and a wire 4. The circular ring 1 includes a circular arc 1-1, a circular arc 1-2, a circular arc 1-3, a circular arc 1-4, a capacitor C11, a capacitor C12, and a capacitor C13. The circular ring 2 includes a circular arc 2-1, a circular arc 2-2, a circular arc 2-3, a circular arc 2-4, a capacitor C21, a capacitor C22, and a capacitor C23. The capacitor C11, the capacitor C12 and the capacitor C13 are evenly connected in series at equal intervals on the circular ring 1, and the capacitor C21, the capacitor C22, and the capacitor C23 are evenly connected in series at equal intervals on the circular ring 2. The capacitors on the circular ring may adjust the coupling effect of the quasi-Helmholtz coil at a specific frequency, so as to make the quasi-Helmholtz coil reach the best coupling effect in the specific frequency of the radio-frequency magnetic field, thereby improving the image quality.

The circular ring 1 and the circular ring 2 are respectively distributed in the chest and the back, and the circular ring 1 and the circular ring 2 are parallel and co-axial. The circular ring 1 and the circular ring 2 disconnect on the side near the arm, and the disconnecting positions are cross-connected together using the wire 3 and the wire 4. As shown in FIG. 2, the circular ring 1 or the circular ring 2 of the quasi-Helmholtz coil respectively includes 3 capacitors, but is not limited to 3. The number of capacitors included in the quasi-Helmholtz coil may be determined according to the operating frequency of the quasi-Helmholtz coil and the maximum voltage that may be endured by the capacitors.

Compared to conventional Helmholtz coils, a quasi-Helmholtz coil that cross-connects the circular ring 1 and the circular ring 2 through the wire 3 and the wire 4 eliminates the coupling effect between the circular ring 1 and the circular ring 2, thus saving the step of performing special post-processing on the coupling effect between the circular ring 1 and the circular ring 2 as a result of employing a conventional Helmholtz coil.

As shown in FIG. 1B, a phased array coil acting as the receiving part RX includes 8 coil units 5, 6, 7, 8, 9, 10, 11 and 12, respectively disposed at positions such as the front side and the rear side, the upper side and the lower side, and the left side and the right side of the shoulder of a subject to be examined. Coils that are adjacent to each other eliminate coupling therebetween by geometric overlap. As shown in FIG. 1B, the number of coil units of the phased array coil acting as the receiving part RX includes 8, but is not limited to 8. A user may select a phased array coil with more than 8 coil units or less than 8 coil units according to requirements. In selecting the number of coil units, it is to be provided that the magnetic resonance signals may be received in the front and back, the left and right and the top and bottom of the shoulder. As shown in FIG. 1A, the number of coil units of the phased array coil acting as the receiving part RX is, for example, 16.

The phased array coil acting as the receiving part RX (e.g., coil units 5-12) is located in the space constructed by the quasi-Helmholtz coil. The coil unit 5 and the coil unit 6 are distributed on the front chest of the shoulder. The coil unit 11 and the coil unit 12 are distributed in the back, while the coil unit 8 and the coil unit 10 are respectively distributed on the front trapezius and the back trapezius. The coil unit 4 and the coil unit 9 are distributed at the acromion position.

In one embodiment, a three-dimensional geometric center of the transmitting part TX coincides with a three-dimensional geometric center of the receiving part RX. The best effect area of the transmitting part TX coincides with the best effect area of the receiving part RX, so that the effect of the magnetic resonance images is better.

According to one embodiment of the shoulder coil of the magnetic resonance system, the quasi-Helmholtz coil may produce a considerably high, uniform radio-frequency magnetic field area, so the shoulder coil may reduce the transmit power of a body coil and lower the overall specific absorption ratio (SAR) of radio frequency. Image quality is further improved as the quasi-Helmholtz coil removes coupling between the two coils. Additionally, in the mechanical aspect, the transmitting part and the receiving part of the shoulder coil are mutually independent, and therefore, may be combined freely for use (e.g., the receiving part may be used alone, and the transmitting part and the receiving part may also be used together, so as to improve the flexibility of the shoulder coil).

Figure 3A:
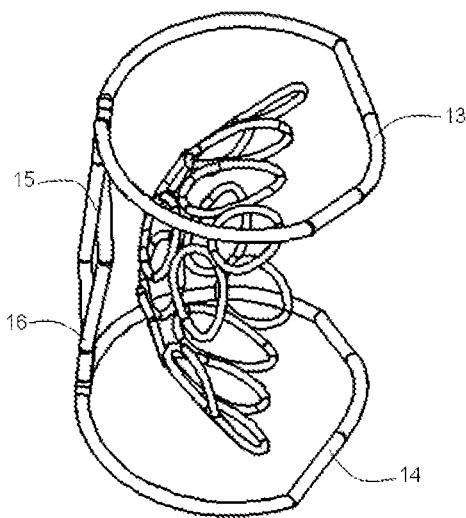
FIG. 3A is a three-dimensional perspective view of one embodiment of a shoulder coil for a magnetic resonance system.
Figure 3B:
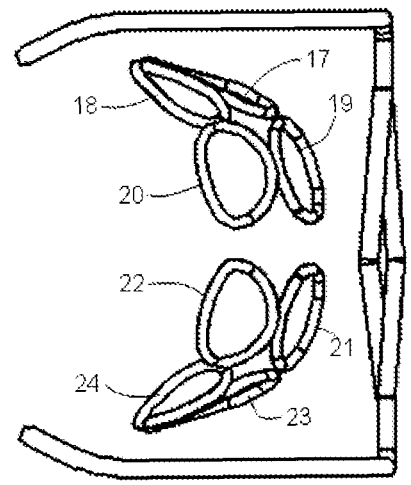
FIG. 3B is a perspective view of the left side of one embodiment of a shoulder coil for a magnetic resonance system.

FIG. 3A is a three-dimensional perspective view of one embodiment of a shoulder coil for a magnetic resonance system. FIG. 3B is a three-dimensional perspective view of one embodiment of a shoulder coil for a magnetic resonance system (e.g., the embodiment of FIG. 3A). FIGS. 3A and 3B only show the internal coils of the shoulder coil of the magnetic resonance system but do not show the external housing.

As shown in FIGS. 3A and 3B, the shoulder coil of the magnetic resonance system is the same as the shoulder coil of the magnetic resonance system according to the embodiment discussed above and includes a transmitting part TX and a receiving part RX. The transmitting part TX is a quasi-Helmholtz coil for coupling radio frequency signals of a body coil in the magnetic resonance system so as to strengthen the radio-frequency magnetic field, and the shape of the transmitting part TX may be adjusted according to the structure and size of the shoulder. The receiving part RX is a phased array coil for receiving magnetic resonance signals fed back by a subject to be examined. The quasi-Helmholtz coil acting as the transmitting part TX includes a circular ring 13, a circular ring 14, a wire 15 and a wire 16. The inner-layer phased array receiving coil acting as the receiving part RX includes coil units 17-24.

The circular ring 13 and the circular ring 14 respectively have an opening. Two ends of the opening are connected to the wire 15 and the wire 16. The wire 15 and the wire 16 intersect once, or the wire 15 and the wire 16 intersect for odd-numbered times.

The quasi-Helmholtz coil acting as the transmitting part TX of the shoulder coil of the magnetic resonance system differs from one or more of the embodiments discussed above in that the circular ring 13 and the circular ring 14 of the quasi-Helmholtz coil are not parallel. The circular ring 13 and the circular ring 14 bend toward each other on an end opposite to the wire connection place. In this way, the shoulder coil of the magnetic resonance system effectively enhances the magnetic field intensity of the radio-frequency magnetic field.

Since the local coil for shoulder joint imaging in the magnetic resonance system includes a transmitting part and a receiving part, and the transmitting part couples a radio-frequency magnetic field from a body coil. The local coil does not need to be connected to the magnetic resonance system via a special transmission cable, so that the local coil has a delicate structure and requires a low cost. The receiving part uses phased array coils and therefore may be optimized according to the structure of the shoulder joint. The shoulder coil may produce a uniform radio-frequency magnetic field area with a considerable intensity, thereby reducing the transmit power of the body coil and lowering the overall specific absorption ratio (SAR) of radio frequency. In the mechanical aspect, the transmitting part and the receiving part of this shoulder coil may be combined freely for use (e.g., the receiving part may be used alone, or the transmitting part and the receiving part are used together, so as to improve the flexibility of applications).

What are described above are merely embodiments of the present invention and are not to limit the present invention. Any modifications, equivalents and improvements within the spirit and principle of the present invention are to be covered by the protection scope of the present invention.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A shoulder coil for a magnetic resonance system, the shoulder coil comprising:
   a receiving part; and
   a transmitting part having two circular rings and two wires, wherein the two circular rings are identical and co-axial, wherein the two circular rings each have an opening with two ends of the opening being respectively connected to the two wires, wherein the two wires intersect an odd-number of times, wherein the two circular rings bend toward each other at an end opposite to the respective opening, and wherein the transmitting part is configured to couple a radio-frequency magnetic field of a body coil of the magnetic resonance system such that no dedicated transmission cable for connecting the transmitting part and the magnetic resonance system is required,
   wherein the receiving part and the transmitting part are mutually independent, and
   wherein the shoulder coil is configured to examine a shoulder of a patient.

2. The shoulder coil as claimed in claim 1, wherein the transmitting part comprises a Helmholtz coil.

3. The shoulder coil as claimed in claim 1, wherein each circular ring of the two circular rings comprises one or more capacitors, and
   wherein the one or more capacitors are connected in series at equal intervals on the circular ring.

4. The shoulder coil as claimed in claim 1, wherein a three-dimensional geometric center of the transmitting part coincides with a three-dimensional geometric center of the receiving part.

5. A transmitting coil of a shoulder coil for a magnetic resonance system, the transmitting coil comprising:
   two circular rings and two wires,
   wherein the two circular rings are identical, parallel to each other and co-axial, the two circular rings respectively having an opening, two ends of each opening being respectively connected to the two wires,
   wherein the two wires intersect for odd-numbered times,
   wherein the transmitting coil is configured to couple a radio-frequency magnetic field of a body coil of the magnetic resonance system such that no dedicated transmission cable for connecting the transmitting part and the magnetic resonance system is required, and
   wherein the transmitting coil is configured to examine a shoulder of a patient.

6. A transmitting coil of a shoulder coil for a magnetic resonance system, the transmitting coil comprising:
   two circular rings and two wires,
   wherein the two circular rings are identical and co-axial, the two circular rings respectively have an opening, two ends of each opening being respectively connected to the two wires, the two wires intersecting for odd-numbered times,
   wherein the two circular rings bend toward each other at an end opposite to the respective opening,
   wherein the transmitting coil is configured to couple a radio-frequency magnetic field of a body coil of the magnetic resonance system such that no dedicated transmission cable for connecting the transmitting part and the magnetic resonance system is required, and
   wherein the transmitting coil is configured to examine a shoulder of a patient.

7. A magnetic resonance system comprising:
   a shoulder coil configured to examine a shoulder of a patient, the shoulder coil comprising:
      a receiving part; and
      a transmitting part having two circular rings and two wires, wherein the two circular rings are identical and co-axial, wherein the two circular rings each have an opening with two ends of the opening being respectively connected to the two wires, wherein the two wires intersect an odd-number of times, wherein the two circular rings bend toward each other at an end opposite to the respective opening, and wherein the transmitting part is configured to couple a radio-frequency magnetic field of a body coil of the magnetic resonance system such that no dedicated transmission cable for connecting the transmitting part and the magnetic resonance system is required,
   wherein the receiving part and the transmitting part are mutually independent.

8. The magnetic resonance system as claimed in claim 7, wherein the transmitting part comprises a Helmholtz coil.

9. The shoulder coil as claimed in claim 7, wherein each circular ring of the two circular rings comprises one or more capacitors, and
   wherein the one or more capacitors are connected in series at equal intervals on the circular ring.

10. The magnetic resonance system as claimed in claim 7, wherein a three-dimensional geometric center of the transmitting part coincides with a three-dimensional geometric center of the receiving part.

11. The magnetic resonance coil as claimed in claim 1, wherein the transmitting part and the receiving part are configured to be respectively used alone or together.

12. The magnetic resonance coil as claimed in claim 1, wherein the receiving coil is a phased array coil.

* * * * *